(12) United States Patent
Kwon et al.

(10) Patent No.: US 8,227,986 B2
(45) Date of Patent: Jul. 24, 2012

(54) FILM UNIT AND PLASMA DISPLAY PANEL HAVING THE SAME

(75) Inventors: Do-Hyuk Kwon, Suwon-si (KR); Sung-Yong Lee, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 693 days.

(21) Appl. No.: 12/322,998

(22) Filed: Feb. 10, 2009

(65) Prior Publication Data
US 2009/0256781 A1  Oct. 15, 2009

(30) Foreign Application Priority Data

Apr. 14, 2008  (KR) .................. 10-2008-0034139

(51) Int. Cl.
*H01J 17/49* (2006.01)
*H01J 5/16* (2006.01)
(52) U.S. Cl. ...................... 313/582; 313/584
(58) Field of Classification Search .......... 313/582–587, 313/112, 110
See application file for complete search history.

(56) References Cited

U.S. PATENT DOCUMENTS

| | | | |
|---|---|---|---|
| 6,090,464 A | 7/2000 | Yoo | |
| 2004/0239248 A1* | 12/2004 | Chang et al. ................ | 313/582 |
| 2005/0275934 A1 | 12/2005 | Ballato et al. | |
| 2006/0103285 A1 | 5/2006 | Lee | |
| 2008/0232058 A1 | 9/2008 | Horiuchi et al. | |

FOREIGN PATENT DOCUMENTS

| | | |
|---|---|---|
| EP | 1482331 | 12/2004 |
| EP | 2085812 | 8/2009 |
| JP | 11-184399 A | 7/1999 |
| JP | 2001-051608 A | 2/2001 |
| JP | 2002-278466 A | 9/2002 |
| JP | 2002-328613 A | 11/2002 |
| JP | 2006-146174 A | 6/2006 |
| JP | 2006-162890 | 6/2006 |
| JP | 2007-58243 A | 3/2007 |
| JP | 2008-234100 A | 10/2008 |
| KR | 1020020077251 A | 10/2002 |
| KR | 1020030001494 A | 1/2003 |
| KR | 1020060131138 | 12/2006 |
| WO | WO 2008/084978 | 7/2008 |

OTHER PUBLICATIONS

European Office Action for Application No. 09251089.0; Applicant: Samsung SDI Co., Ltd.; Dated Jun. 24, 2010; 7 pgs; European Patent Office.
JPO Office Action dated Jan. 4, 2011, 4 pages.
European Patent Gazette issued on Aug. 17, 2011 regarding the European Patent Application No. 09251089.0, 1 page.

\* cited by examiner

*Primary Examiner* — Joseph L Williams
(74) *Attorney, Agent, or Firm* — Knobbe Martens Olson & Bear LLP

(57) ABSTRACT

Provided are a film unit which can protect a screen of a display device by absorbing and spreading an impact applied from the outside of the display device, and a plasma display panel having the film unit. The film unit includes a base film having a predetermined area and thickness and provided with a plurality of openings formed in a direction of the thickness thereof; and a cover layer sealing tops of the plurality of openings so that a self-elasticity is formed by an air layer positioned in a closed space of the opening.

20 Claims, 3 Drawing Sheets

FILM UNIT AND PLASMA DISPLAY PANEL HAVING THE SAME

CROSS-REFERENCE TO RELATED APPLICATIONS

This application claims priority to and the benefit of Korean Patent Application No. 10-2008-0034139, filed on Apr. 14, 2008, in the Korean Intellectual Property Office, the entire content of which is incorporated herein by reference.

BACKGROUND OF THE INVENTION

1. Field of the Invention

The present embodiments relate to a film unit which can protect a screen of a display device by absorbing and spreading an impact applied from the outside of the display device, and a plasma display panel having the same.

2. Description of the Related Art

Since plasma display panels (PDPs) are larger in size and slimmer in thickness than CRTs, they have been continuously researched and developed as one of next-generation display devices.

Since a PDP is driven by discharge, strong electromagnetic waves are radiated, and such electromagnetic waves have an influence on other electronic devices. Therefore, it is required to shield electromagnetic waves radiated from conventional PDPs under the regulation standard value. To this end, most of the conventional PDPs employ front filters which can shield electromagnetic waves and near-infrared light, and enhance a bright room contrast ratio by lowering reflexibility of external light.

Front filters may be divided into a glass filter formed with glass and a film filter formed without glass. Since the film filter has advantages of lightweight, slimness, and improved double images as compared with the glass filter, it has been widely used.

However, the film filter has a lower capability of blocking or reducing external impact applied to the front of a PDP than the glass filter. Therefore, a PDP having a conventional film filter may cause malfunction and appearance deformation due to external impact applied to the front of the PDP. The present embodiments overcome the above problems as well as provide additional advantages.

SUMMARY OF THE INVENTION

Accordingly, some embodiments provide a film unit for display directly attached on the front of a PDP device, which can protect functions of the device and prevent appearance deformation by absorbing and spreading impact applied to the outside of the device.

Other embodiments provide a PDP having the aforementioned film unit, which can improve durability.

According to an aspect of the present embodiments, provided is a film unit for display, which includes: a base film having a predetermined area and thickness and provided with a plurality of openings formed in a direction of the thickness thereof; and a cover layer sealing tops of the plurality of openings so that a self-elasticity is formed by an air layer positioned in a closed space of the opening.

Preferably, the base film has a plurality of ribs, and the entire structure of the plurality of ribs is a lattice structure or an open lattice structure.

The height of the rib may be 50 to 200 μm, and the width of the rib may be 5 to 50 μm.

The film unit may further include an adhesive layer to adhere the cover layer to the base film. The adhesive layer may include a coloring matter for at least one of color correction, near-infrared light shielding and neon light shielding.

The cover layer may be an anti-reflection layer. In this embodiment, the film unit may further include a hard coating member included in the anti-reflection layer or disposed on one surface of the anti-reflection layer.

The film unit may further include a conductive layer disposed on one surface of the base film. In addition, the film unit may further include a color correction layer disposed on the one surface of the base film. Moreover, the film unit may further include a transparent film disposed on the one surface of the base film.

The base film may be made of polyethylene terephthalate.

According to another aspect of the present embodiments, provided is a plasma display panel, which includes a panel body disposed on one surface of the film unit according to the aforementioned aspect of the present embodiments.

The film unit of the present embodiments has an excellent capability of absorbing impact, so that the screen of a display device can be effectively protected. Further, since the film unit of the present embodiments is directly attached on one surface of a conventional film filter or the entire surface of the display device, so that it is convenient to use the film unit. Furthermore, the bright room contrast ratio of the display device can be improved through openings disposed corresponding to a discharge cell region and ribs having a blackish color.

BRIEF DESCRIPTION OF THE DRAWINGS

The accompanying drawings, together with the specification, illustrate illustrative embodiments, and, together with the description, serve to explain the principles of the present embodiments.

DETAILED DESCRIPTION OF PREFERRED EMBODIMENTS

Figure 1A:
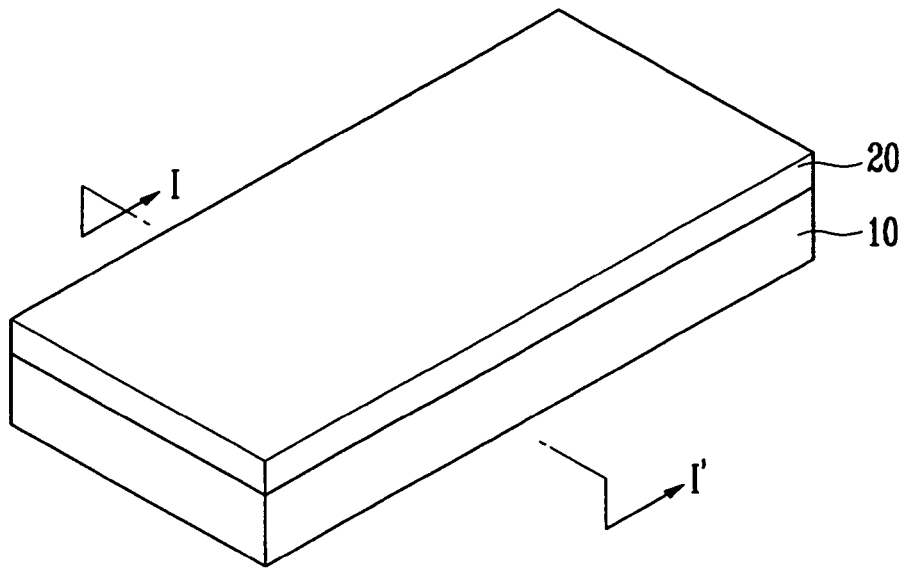
FIG. 1A is a perspective view of a film unit for display according to an embodiment.

In the following detailed description, only certain exemplary embodiments have been shown and described, simply by way of illustration. As those skilled in the art would realize, the described embodiments may be modified in various different ways, all without departing from the spirit or scope of the present embodiments. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Figure 2:
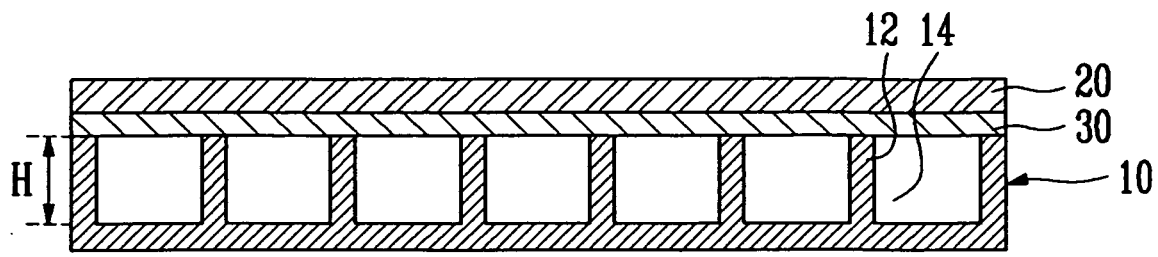
FIG. 2 is a cross-sectional view of a film unit according to another embodiment.

FIG. 1A is a perspective view of a film unit for display according to an embodiment. FIG. 2 is a cross-sectional view of a film unit according to another embodiment.

Figure 1B:
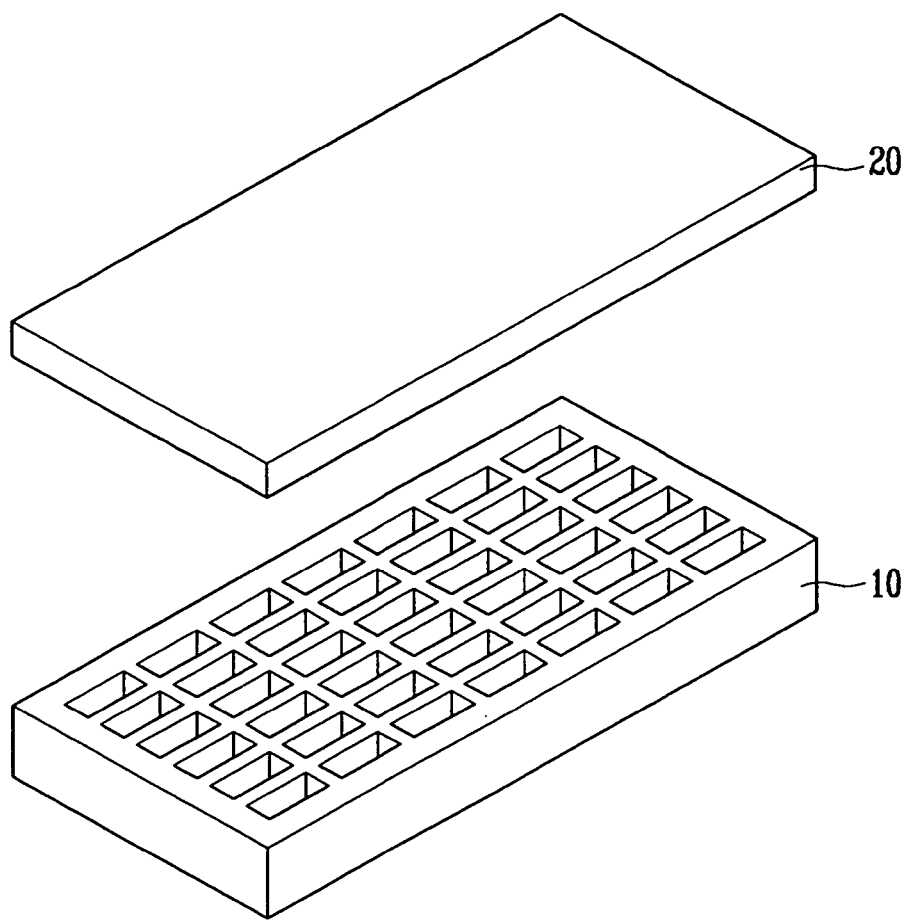
FIG. 1B is an exploded perspective view of the film unit of FIG. 1A.

Referring to FIGS. 1A and 1B, the film unit of this embodiment includes a base film 10 and a cover layer 20 disposed on a surface of the base film 10.

The base film 10 has a predetermined area and thickness and is provided with a plurality of openings formed in a direction of the thickness thereof. The openings may have a shape of a plurality of recesses or trenches formed on the surface of the base film 10.

The cover layer 20 is disposed on the surface of the base film 10 and covers the tops of the plurality of openings of the base film 10. In this embodiment, since an air layer is formed inside each of the plurality of openings, elasticity can be provided to the film unit itself.

Preferably, the film unit of this embodiment is disposed at the uppermost layer of a display device. Thus, it is the preferable that the cover layer 20 is formed as an anti-reflection layer. The plurality of openings will be described in detail below.

FIG. 2 is a cross-sectional view of a film unit according to another embodiment. FIG. 2 may be taken along line I-I' of FIG. 1A.

Referring to FIG. 2, the film unit includes a base film 10, a cover layer (hereinafter, referred to as an "anti-reflection layer") disposed on a surface of the base film 10, and an adhesive layer 30 adhering the anti-reflection layer 20 to the surface of the base film 10.

The base film 10 is provided with a plurality of openings 14 partitioned by a plurality of ribs 12. The base film 10 may be formed using a material with high mechanical strength, low heat shrinkage, and a small quantity of oligomers generated when being heated, while considering the balance of physical and optical properties.

The base film 10 is used as a support member and includes any one of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate, triacetate cellulose (TAC) and cellulose acetate propionate (CAP). Particularly, PET is suitable for the material of the base film 10.

In some embodiments, PET is used as the material of the base film 10. In such embodiments, the height H of the rib 12 is set to be from about 50 to about 200 μm. The height H of the rib 12 may be adjusted depending on the entire size of the film unit and the width of the rib 12.

In some embodiments, the anti-reflection layer 20 is disposed to minimize the loss of light transmitted while sealing one end of the opening 14 and to prevent the reflection and diffused reflection of external light. The anti-reflection layer 20 may be formed into a single-layered or multi-layered structure. An anti-reflection layer 20 of a single-layered structure includes a thin film disposed in an optical film thickness with a ¼ wavelength, which is made of transparent fluorine-based polymer resin, fluorinated magnesium, silicon-based resin, silicon oxide or the like. The anti-reflection layer 20 of a multi-layered structure includes a thin film made of inorganic and organic compounds with different refractive indices laminated to have two or more layers. Here, the inorganic compound includes a metal oxide, a fluorinated compound, a silicide, a boride, a carbide, a nitride, a sulfide or the like, and the organic compound includes silicon-based resin, acrylic resin, fluorine-based resin or the like. The anti-reflection layer 20 may be formed using a method including sputtering, ion plating, ion beam assist, vapor deposition, chemical vapor deposition (CVD), physical vapor deposition, or the like.

In the specification, the term "transparency" refers to both a visible-light transmittance of about 100% and a certain degree of transmittance less than about 100% which are generally regarded as transparent in the art.

The adhesive layer 30 covers the tops of the openings 14 so that the openings 14 of the base film 10 are sealed hermetically. A portion of a material of the adhesive layer 30 may be slightly inserted into the opening 14 depending on the material of the adhesive layer 30.

Meanwhile, the film unit of this embodiment may include another adhesive layer disposed on the other surface of the base film 10. In this embodiment, the adhesive layer may be used to attach the film unit of the present embodiments on a front surface of a display device, i.e., a surface of a glass or film filter for a display device.

The material of the adhesive layer 30 may include a thermoplastic resin such as acryl series, silicon series, urethane series, or polyvinyl series, and/or a transparent adhesive or gluing agent such as an ultraviolet curable resin. For example, a silicon adhesive such as an acrylate-based resin or a pressure sensitive adhesive (PSA) may be used as the material of the adhesive layer 30.

In some embodiments, the adhesive layer 30 may include a colorant such as a dye or pigment that selectively absorbs light of a specific wavelength in a visible light region so as to correct colors to shield near-infrared or neon light. For example, the colorant may include a cyanine-based, squarilium-based, azomethine-based, xanthene-based, oxonol-based, and azo-based compound that shield unnecessary light near about 585 μm wavelength emitted when neon is excited. The kind and concentration of the colorant may be determined from the absorbing wavelength and coefficient of the colorant, the color of a transparent conductive layer, the transmitting characteristic and transmittance required in the filter, and the like.

Hereinafter, a method of fabricating the aforementioned film unit for display according to the present embodiments will be described.

Polyethylene terephthalate pellets can be melted at from about 290 to about 300° C., and a film with a thickness of about 200 μm is fabricated using an extruder. The film is biaxially extended (laterally and longitudinally stretched) while being heated again, thereby preparing a PET film with a thickness of about 100 μm.

The prepared PET film is patterned through a laser etching process to prepare a base film 10 having ribs 12 with a predetermined pattern and openings 14.

An adhesive layer 30 is laminated on a surface of the base film 10.

The base film 10 having the adhesive layer 30 laminated on the surface thereof and an anti-reflection film prepared previously are laminated using a roll-to-roll method. Here, the anti-reflection layer is prepared by laminating an anti-reflection layer 20 on one surface of another PET film with a thickness of, for example, about 188 μm and laminating an adhesive layer on the other surface of the PET film. Accordingly, the film unit is fabricated through the aforementioned fabrication processes. For reference, in the specification, the term "anti-reflection layer" means not only an anti-reflection layer itself coated on a transparent film but also an anti-reflection film having an anti-reflection layer coated on one surface thereof.

According to the aforementioned configuration, when impact is applied to the film unit from the outside, the air layer in the opening 14 serves as a cushion, so that the impact can be effectively absorbed and spread.

Figure 3A:
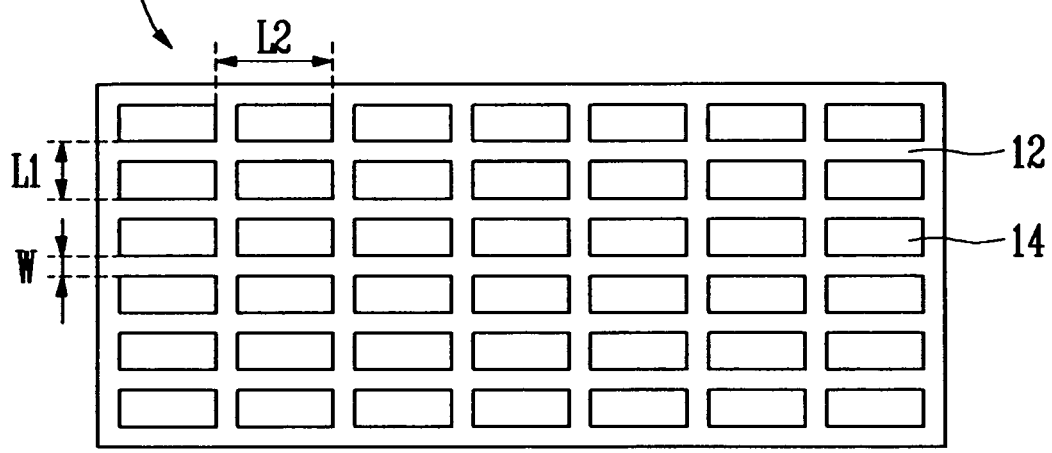
FIG. 3A is a plan view of a base film of a film unit applicable to the present embodiments.

FIG. 3A is a plan view of a base film of a film unit according to an embodiment.

Referring to FIG. 3A, the base film 10 includes ribs 12 with a lattice structure and a plurality of openings 14 partitioned by the ribs 12. Such a lattice structure is similar to the structure of a black matrix used in a conventional display device. If the opening 14 of the base film 10 are sealed by a cover layer, an air layer is formed in the opening 14. According to the aforementioned structure, when impact is applied to the base film 10 from the outside, the air layer in the opening 14 serves as a cushion, so that the impact can be effectively absorbed and spread.

Considering the structure of the air layer of the film unit and the film unit attached on a visible surface of the display device, the width W of the rib 12 can be from about 5 to about 50 μm, the distance L1 between the ribs in a width direction of the film unit can be from about 50 to about 300 μm, and the distance L2 between the ribs in a length direction of the film unit can be from about 50 μm or more. In the aforementioned range, a specific design value may be more precisely determined depending on the size of the display device in which the film unit is mounted, the pitch between cells, and the like.

Figure 3B:
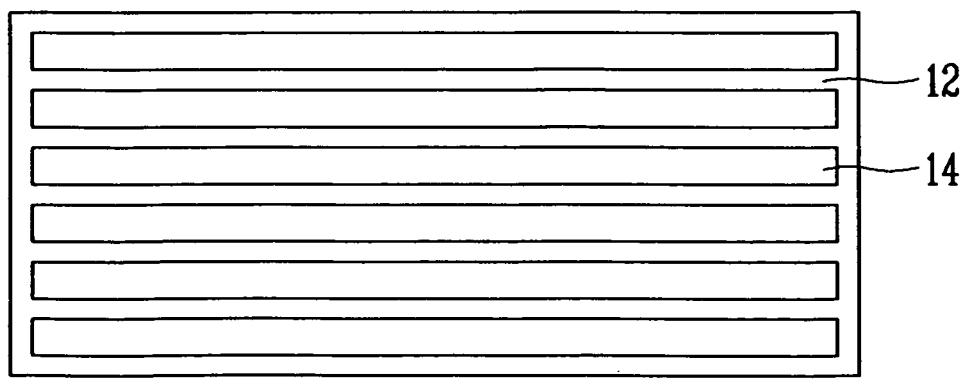
FIG. 3B is a plan view of a base film of a film unit applicable to the present embodiments.

FIG. 3B is a plan view of a base film of a film unit according to another embodiment.

Referring to FIG. 3B, the base film 10a may have ribs 12 with an open lattice structure in which ribs positioned in the length direction of the film unit with the aforementioned lattice structure are removed. Here, the open lattice structure may be a structure in which openings 14 partitioned by the ribs 12 are formed in a stripe shape extending in the length direction of the film unit. If both sides of the base film 10a are sealed, a stripe-shaped air layer is formed in the opening 14. According to the aforementioned structure, when impact is applied to the base film 10a from the outside, a plurality of stripe-shaped air layers serve as cushions, so that the impact can be effectively absorbed and spread.

The width of the rib 12 of the base film 10a can be from 5 to about 50 μm, and the distance between the ribs 12 in a width direction of the film unit can be from about 50 to about 300 μm. These ranges are equal to those of the base film 10 described with reference to FIG. 3A, except the aforementioned distance between the ribs in a length direction of the unit film.

Figure 4:
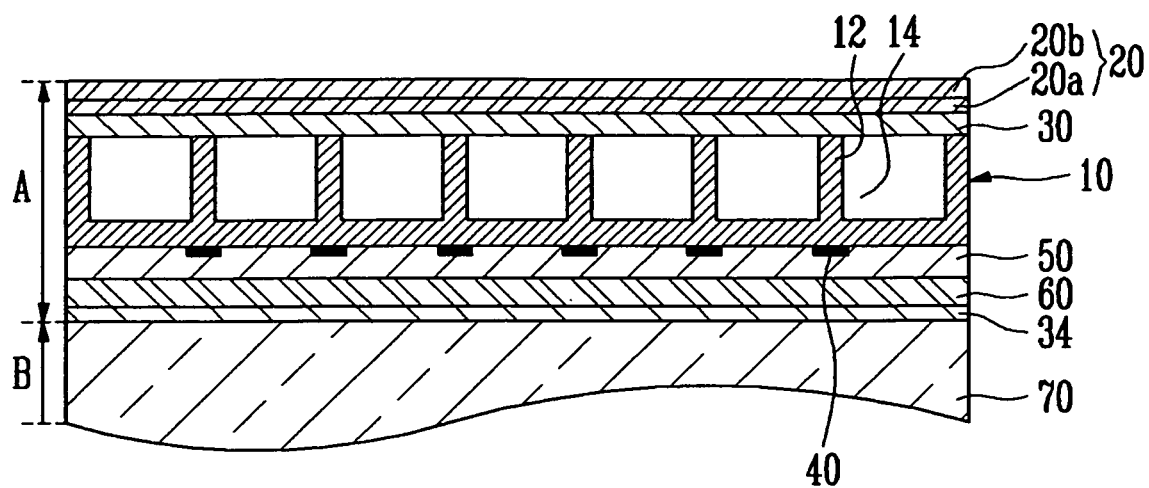
FIG. 4 is a partial cross-sectional view of a plasma display panel having a film unit according to still another embodiment.

FIG. 4 is a partial cross-sectional view of a plasma display panel (PDP) having a film unit according to still another embodiment.

Referring to FIG. 4, the PDP includes a film unit and a panel body having the film unit attached on one surface (visible surface) of the panel body. In FIG. 4, section A represents a region in which the film unit is attached, and section B represents a region in which a transparent front substrate of the panel body is attached.

The film unit basically includes the film unit described with reference to FIGS. 1A to 3B. In this embodiment, the film unit may further include a functional layer capable of shielding electromagnetic waves, near-infrared light and neon light.

For example, the film unit may be provided with a lower film having a structure in which a conductive layer 40, a transparent film 50, a color correction layer 60 and an adhesive layer 34 are sequentially laminated.

The conductive layer 40 is provided to shield electromagnetic waves harmful for human bodies and near-infrared light, which are generated from the panel body. The near infrared light may cause malfunction of peripheral electronic devices. The conductive layer 40 may be formed into a single-layered or multi-layered structure. In the case of the multi-layered structure, the surface resistance of the conductive layer 40 is easily corrected, and thus, the transmittance of visible light can be adjusted through the surface resistance. The conductive layer 40 may be formed of a metal layer, a metal oxide, a conductive polymer or the like. The metal layer includes at least one of Pd, Cu, Pt, Rh, Al, Fe, Co, Ni, Zn, Ru, Sn, W, Ir, Pb, Ag and the like. The metal oxide includes at least one of tin oxide, indium oxide, antimony oxide, zinc oxide, zirconium oxide, titanium oxide, magnesium oxide, silicon oxide, aluminum oxide, metal alkoxide, indium tin oxide, ATO and the like.

The color correction layer 60 is provided to absorb near-infrared light and/or neon light. The color correction layer 60 may be formed by coating a polymer film of a polymer film formed by mixing at least one or more kinds of coloring matters in a transparent resin, a material formed by coating a pigment obtained by applying at least one or more kinds of coloring matters in a resin binder and an organic solvent on a transparent substrate, and a gluing agent containing at least one or more kinds of coloring matters. Here, the term "containing" refers to not only the state that at least one or more kinds of coloring matters are contained in a substrate, a layer, or a gluing agent but also the state that the at least one or more kinds of coloring matters are coated on a surface of a substrate or a layer.

The transparent film 50 is basically provided to support the conductive layer 40 and/or the color correction layer 60. For example, using the transparent film 50 as a substrate, the conductive layer 40 may be formed on one surface of the transparent film 50, and the color correction layer 60 may be formed on the other surface of the transparent film 50.

The adhesive layer 34 is provided to attach the film unit including the conductive layer 40 and the color correction layer 60 on the visible surface of the panel body. In this embodiment, if the color correction layer 60 contains one kind or plural kinds of coloring matters, the adhesive layer 34 may be omitted.

As well as the aforementioned laminated structure, the film unit may be configured by disposing the conductive layer 40 as an upper film of the base film, by exchanging the positions of the conductive layer 40 and the color correction layer 60, or by adding another transparent film and/or another adhesive to the top surface and/or the bottom surface of the base film 10.

The film unit may further include a layer 20a preventing reflection and a hard coating member 20b coated on one surface (top surface) of the layer 20a. The hard coating member 20b is provided to prevent scratches due to various types of external forces. An acryl-based, urethane-based, epoxy-based or siloxane-based polymer may be used as the hard coating member 20b, or an ultraviolet curing resin such as oligomer may be used as the hard coating member 20b. In order to enhance strength, a silica-based filler may be added to the hard coating member 20b. In order to obtain a desired effect, the thickness of the anti-reflection layer 20 including the hard coating member 20b can be from about 2 to about 7 μm.

It will be apparent that the hard coating member 20b may be inserted into the layer 20a preventing reflection or disposed on the other surface (bottom surface) of the layer 20a.

Optical characteristics of the film unit including the hard coating member 20b are designed so that the haze is low as from about 1 to about 3%, the visible-light transmittance is from about 30% to about 90%, the external light reflexibility is low as from about 1% to about 20%, the thermal resistance is a glass transition temperature or more, and the pencil hardness is from about 1H to about 3H.

The aforementioned panel body refers to a PDP which is not provided with a front filter, and includes an X-Y electrode disposed on the other surface of a transparent first electrode 70, a front plate having a dielectric layer and a protection layer, an address electrode mounted on a second substrate disposed opposite to the first substrate 70, a rear plate having a dielectric layer, ribs and a phosphor layer, a chassis base attached on a rear surface of the panel body (B) to support the front and rear plates, and a driving circuit board.

In the panel body, the ribs partition a discharge space into a large number of discharge cells, and a red, green or blue phosphor layer is coated on side surfaces of the ribs. A gas such as neon is injected into the spaces of the discharge cells. In the aforementioned panel body, discharge generated in the discharge cell is controlled by a voltage applied through the X-Y electrode and the address electrode, thereby displaying images. The X-Y electrode and the address electrode are controlled by a control circuit of the driving circuit board.

In the aforementioned embodiment, a PDP has been described as an example of the display device having the film unit of the present embodiments. However, the present embodiments are not limited thereto. The present embodiments can be applied to display devices such as a field effect display (FED), a vacuum fluorescent display (VFD), an organic light emitting display (OLED) and a liquid crystal display (LCD).

While the present embodiments have been described in connection with certain exemplary embodiments, it is to be understood that the embodiments are not limited to the disclosed embodiments, but, on the contrary, is intended to cover various modifications and equivalent arrangements included within the spirit and scope of the appended claims, and equivalents thereof.

What is claimed is:

1. A film unit configured to display, comprising:
   a base film having a predetermined area and thickness with a plurality of openings formed in a direction of the thickness thereof; wherein the openings have a shape of a plurality of recesses or trenches formed on the surface of the base film; and
   a cover layer sealing tops of the plurality of openings so that a self-elasticity is formed by an air layer positioned in a closed space of the opening,
   wherein the openings in the base film are defined by a plurality of ribs, and the width of the rib is from about 5 μm to about 50 μm.

2. The film unit as claimed in claim 1, wherein the structure of the plurality of ribs is a lattice structure or an open lattice structure.

3. The film unit as claimed in claim 2, wherein the height of the rib is from about 50 μm to about 200 μm.

4. The film unit as claimed in claim 1, further comprising an adhesive layer configured to adhere the cover layer to the base film.

5. The film unit as claimed in claim 4, wherein the adhesive layer comprises a coloring matter for at least one of color correction, near-infrared light shielding and neon light shielding.

6. The film unit as claimed in claim 1, wherein
   the cover layer is an anti-reflection layer,
   the unit film further comprises a hard coating member included in the anti-reflection layer or disposed on one surface of the anti-reflection layer.

7. The film unit as claimed in claim 1, further comprising a conductive layer disposed on one surface of the base film.

8. The film unit for display as claimed in claim 1, further comprising a color correction layer disposed on the one surface of the base film.

9. The film unit as claimed in claim 1, further comprising a transparent film disposed on the one surface of the base film.

10. The film unit for display as claimed in claim 1, wherein the base film is made of polyethylene terephthalate.

11. A plasma display panel, comprising:
    a film unit as claimed in claim 1; and
    a panel body wherein the film unit is disposed on the panel body.

12. A plasma display panel, comprising:
    a film unit as claimed in claim 2; and
    a panel body wherein the film unit is disposed on the panel body.

13. A plasma display panel, comprising:
    a film unit as claimed in claim 3; and
    a panel body wherein the film unit is disposed on the panel body.

14. A plasma display panel, comprising:
    a film unit as claimed in claim 4; and
    a panel body wherein the film unit is disposed on the panel body.

15. A plasma display panel, comprising:
    a film unit as claimed in claim 5; and
    a panel body wherein the film unit is disposed on the panel body.

16. A plasma display panel, comprising:
    a film unit as claimed in claim 6; and
    a panel body wherein the film unit is disposed on the panel body.

17. A plasma display panel, comprising:
    a film unit as claimed in claim 7; and
    a panel body wherein the film unit is disposed on the panel body.

18. A plasma display panel, comprising:
    a film unit as claimed in claim 8; and
    a panel body wherein the film unit is disposed on the panel body.

19. A plasma display panel, comprising:
    a film unit as claimed in claim 9; and
    a panel body wherein the film unit is disposed on the panel body.

20. A plasma display panel, comprising:
    a film unit as claimed in claim 10; and
    a panel body wherein the film unit is disposed on the panel body.

* * * * *